United States Patent [19]

Huang et al.

[11] Patent Number: 5,789,766

[45] Date of Patent: Aug. 4, 1998

[54] LED ARRAY WITH STACKED DRIVER CIRCUITS AND METHODS OF MANFACTURE

[75] Inventors: Rong-Ting Huang, Gilbert; Chan-Long Shieh, Paradise Valley; Phil Wright, Scottsdale, all of Ariz.

[73] Assignee: Motorola, Inc., Schaumburg, Ill.

[21] Appl. No.: 820,851

[22] Filed: Mar. 20, 1997

[51] Int. Cl.$^6$ .......................... H01L 33/00; H01L 27/15; H01L 31/12; H01L 31/153

[52] U.S. Cl. .................. 257/88; 257/83; 257/84

[58] Field of Search .......................... 257/88, 83, 84

[56] References Cited

U.S. PATENT DOCUMENTS 5,357,121 10/1994 Miyashita et al. .
5,583,350 12/1996 Norman et al. .

FOREIGN PATENT DOCUMENTS 63-263776 10/1988 Japan .

*Primary Examiner*—Stephen Meier
*Attorney, Agent, or Firm*—Eugene A. Parsons

[57] ABSTRACT

A method of fabricating an LED array and stacked driving circuitry includes sequentially forming layers of material on the surface of a substrate, the layers cooperating to emit light when activated. An insulating layer is positioned on the layers and divided into LEDs arranged in an array of rows and columns. Row and column driver circuits are formed on the insulating layer overlying the array by patterning portions of recrystallized amorphous silicon on the insulating layer, depositing a gate insulator layer and a gate metal layer on each of the portions to form an MOS gate, implanting a source and drain in each of the portions, using the MOS gate as a self-aligned mask, and forming contacts for the power terminals and the MOS gate, and coupling each LED in the array to the row and column driver circuits.

11 Claims, 8 Drawing Sheets

LED ARRAY WITH STACKED DRIVER CIRCUITS AND METHODS OF MANFACTURE

FIELD OF THE INVENTION

The present invention pertains to arrays of light emitting devices and more specifically to the integration of driver circuits with light emitting device arrays and methods of manufacture.

BACKGROUND OF THE INVENTION

Displays utilizing two dimensional arrays, or matrices, of pixels each containing one or more light emitting devices are very popular in the electronic field and especially in portable electronic and communication devices, because large amounts of data and pictures can be transmitted very rapidly and to virtually any location.

Light emitting device (LED) arrays are becoming more popular as an image source in both direct view and virtual image displays. One reason for this is the fact that LEDs are capable of generating relatively high amounts of light (high luminance), which means that displays incorporating LED arrays can be used in a greater variety of ambient conditions. For example, reflective LCDs can only be used in high ambient light conditions because they derive their light from the ambient light, i.e. the ambient light is reflected by the LCDs. Some transflective LCDs are designed to operate in a transmissive mode and incorporate a backlighting arrangement for use when ambient light is insufficient. In addition, transflective displays have a certain visual aspect and some users prefer a bright emissive display. However, these types of displays are generally too large for practical use in very small devices.

Also, organic light emitting diodes or organic electroluminescent devices and arrays thereof (hereinafter included as LEDs) are emerging as a potentially viable design choice for use in small products, especially small portable electronic devices, such as pagers, cellular and portable telephones, two-way radios, data banks, etc. organic LED arrays are capable of generating sufficient light for use in displays under a variety of ambient light conditions (from little or no ambient light to bright ambient light). Further, organic LEDs can be fabricated relatively cheaply and in a variety of sizes from very small (less than a tenth millimeter in diameter) to relatively large (greater than an inch) so that organic LED arrays can be fabricated in a variety of sizes. Also, organic LEDs have the added advantage that their emissive operation provides a very wide viewing angle.

A major disadvantage in the use of LED arrays is the complexity of the manufacturing process. In passive arrays, for example, each LED requires two contacts, generally an anode and a cathode, connected to column and row buses. The arrays are generally manufactured by depositing materials on a supporting substrate and addressing/driver connections to row and column buses are made around the edges. In the prior art, a hybrid LED array semiconductor die is mounted on a supporting substrate, such as glass, along with silicon driver dies to form a complete structure. A problem with this structure is that the number of input/output (I/O) terminals of the driver dies must match the I/O count of the LED array. Thus, the size of the supporting substrate is limited at the array size of interest by the I/O pads or terminals. Further, providing very small contact pads (e.g. bump pads) in an effort to improve the size, greatly reduces the assembly yield. Another problem in the driver circuitry arises because of the use of D-MESFETs, which have a relatively high power consumption with a poor reproducibility of MESFET characteristics and a complexity of integrated processing.

In most integration schemes in which the driver circuits and LED arrays are formed on supporting substrates as hybrid circuits, rather than true integrated circuits on a single chip or die. This is a result of the fact that integrating the driver circuits on the same chip or die as the LED array requires positioning the driver circuits around the edges of the LED array. This positioning requires a substantial amount of chip surface to receive the driver circuits and the interconnect metal and greatly limits the size of the array, since the overall size of the chips or dies is greatly limited by practical manufacturing considerations and yield. Hybrid circuits, however, are also limited in size by practical considerations and, in addition, require substantially more power to operate and increased numbers of fabrication and assembly steps.

Accordingly, it would be beneficial to provide an LED array and driving circuitry which overcomes these problems.

It is a purpose of the present invention to provide a new and improved LED array and stacked driving circuitry.

It is another purpose of the present invention to provide a new and improved LED array and stacked driving circuitry which substantially reduces the amount of surface area required and, therefore, allows the production of larger arrays.

It is also purpose of the present invention to provide a new and improved LED array and stacked driving circuitry which requires less manufacturing steps and is simpler to manufacture.

It is another purpose of the present invention to provide a new and improved LED array and stacked driving circuitry with reduced I/O count.

It is still another purpose of the present invention to provide a new and improved LED array and stacked driving circuitry which is easier and less expensive to fabricate and use.

It is a further purpose of the present invention to provide a new and improved LED array and stacked driving circuitry in which the LED array and driver circuitry are integrated onto a single substrate to greatly reduce the I/O count and matching problems.

It is a further purpose of the present invention to provide a new and improved LED array and stacked driving circuitry in which the driving circuitry includes CMOS circuitry.

It is a further purpose of the present invention to provide a new and improved LED array and stacked driving circuitry in which the metal interconnects are substantially reduced in size and length.

SUMMARY OF THE INVENTION

The above problems and others are at least partially solved and the above purposes and others are realized in a method of fabricating an LED array and stacked driving circuitry including sequentially forming layers of material on the surface of a substrate, the layers cooperating to emit light when activated. An insulating layer is positioned on the layers and divided into LEDs arranged in an array of rows and columns. Row and column driver circuits are formed on the insulating layer overlying the array by patterning portions of recrystallized amorphous silicon on the insulating layer, depositing a gate insulator layer and a gate metal layer on each of the portions to form an MOS gate, implanting a source and drain in each of the portions, using the MOS gate as a self-aligned mask, and forming contacts for the power terminals and the MOS gate, and coupling each LED in the array to the row and column driver circuits.

In specific embodiments, the LED array and stacked driving circuitry can include either a passive or an active LED array and, if an active array is included the active circuitry associated with each LED is formed in overlying relationship to the array and adjacent each associated LED. A second insulator layer is then formed over the active circuits and the driving circuitry if formed on the second insulator layer, as described above. In a further specific embodiment a passivation layer is formed over the row and column driver circuits and a supporting substrate is attached to the passivation layer. The semiconductor substrate is removed to expose a surface of the plurality of layers of material and the exposed surface of the plurality of layers of material is etched to form light emission windows. Ohmic metal contacts are deposited in communication with the row and column driver circuits.

BRIEF DESCRIPTION OF THE DRAWINGS

Referring to the drawings.

DESCRIPTION OF THE PREFERRED EMBODIMENTS

Figure 1:
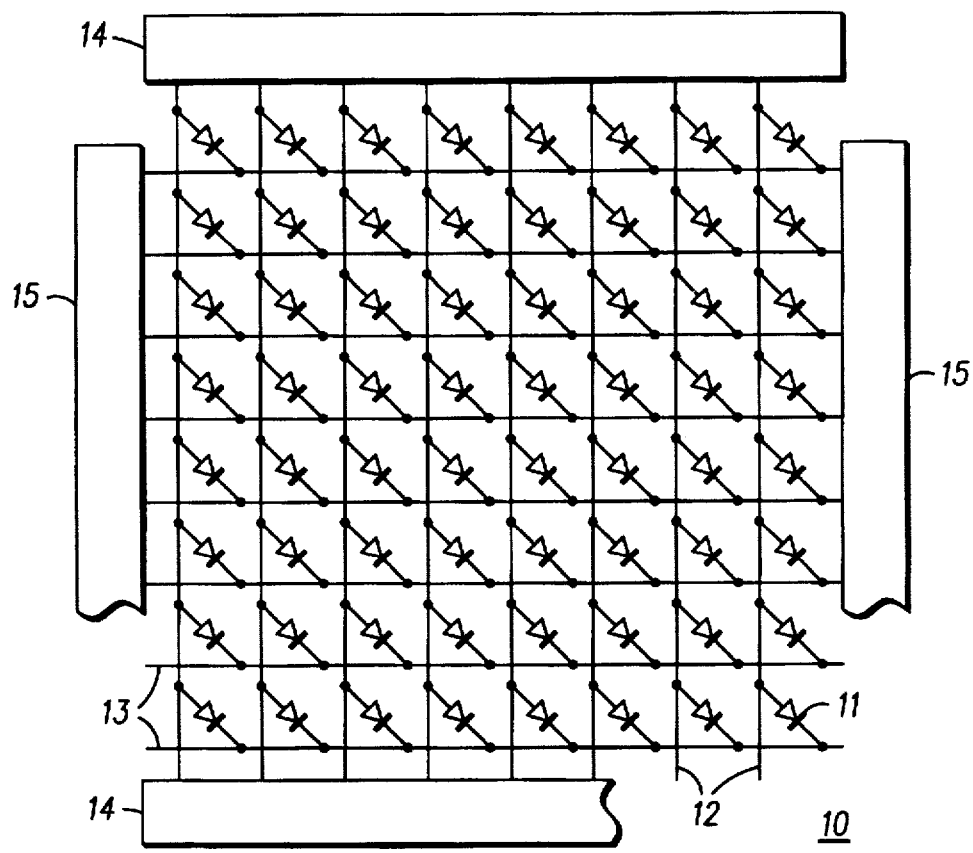
FIG. 1 is a simplified schematic diagram of a passive LED matrix and driver circuitry.

Turning now to the drawings, FIG. 1 illustrates a simplified schematic drawing of a passive LED array 10 and driver circuitry (shown in block form). Passive array 10 includes a plurality of LEDs 11 arranged in rows and columns with the anodes connected into columns by column buses 12 and the cathodes connected into rows by row buses 13. The column buses 12 are connected to column driver circuits 14 and the row buses 13 are connected to row driver circuits 15. As will be seen presently, array 10 and column and row driver circuits 14 and 15 are all formed on a single semiconductor substrate. Generally, column drivers 14 and row drivers 15 are split into two groups connected on opposite sides of the array, which split is made so that alternate column buses terminate on opposite sides of the array to allow more area for the connection of each driver. Also, as will be understood presently, the column and row driver circuits 14 and 15 are split to reduce the length of interconnecting metal.

Figure 2:
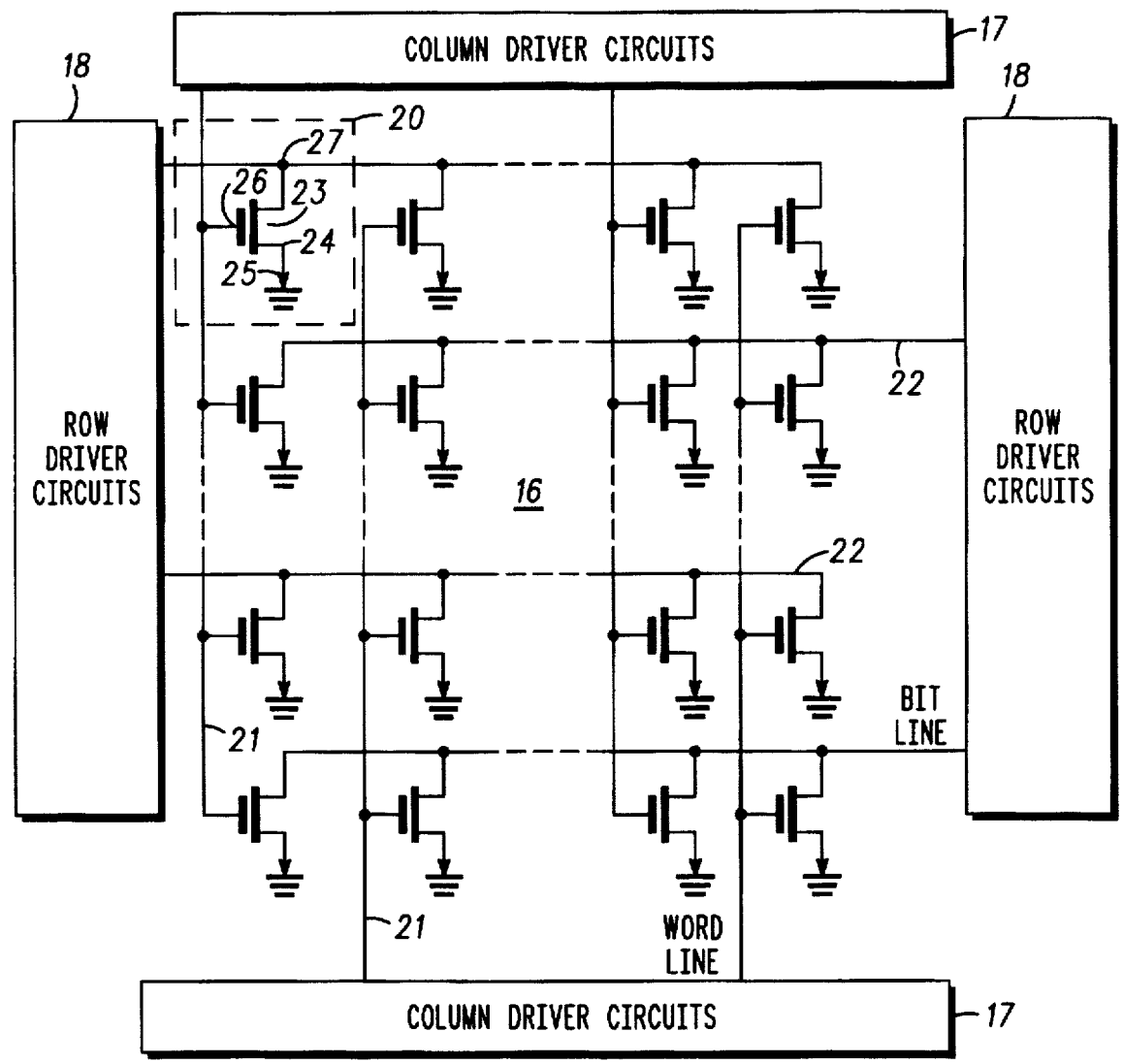
FIG. 2 is a simplified schematic diagram of an active LED matrix and driver circuitry.

Referring specifically to FIG. 2, a simplified schematic diagram is illustrated of an active matrix 16, column driver circuits 17 and row driver circuits 18 in accordance with the present invention. As will be seen presently, active matrix 16 and column and row driver circuits 17 and 18 are all formed on a single semiconductor substrate. As explained above, column drivers 17 and row drivers 18 are each split into two groups connected on opposite sides of the array so that alternate row buses terminate on opposite sides of the array to allow more area for each driver and, similarly, alternate column buses terminate on opposite sides of the array.

Active matrix 16 includes a plurality of pixels 20 arranged in columns and rows with each column having an associated column bus 21 and each row having an associated row bus 22. Each pixel 20 of active matrix 16 includes a field effect transistor (FET) 23 and a light emitting device (LED) 25. A source 24 of FET 23 is connected to the anode of the associated (LED) 25, a gate 26 is connected to the associated column bus 21, and a drain 27 is connected to the associated row bus 22. The cathode of LED 25 is connected to a common potential, such as ground. It will of course be understood that LEDs 25 could be constructed with the cathode connected to a power terminal of FET 23 and the anode connected to the common potential, such as ground, if convenient.

While a single FET 23 is illustrated to represent an active control circuit it will be understood by those skilled in the art that additional components can be incorporated. Also, while n-type MOSFETs are incorporated as the active switch and CMOS drivers are used as row and column drivers in the preferred embodiment, it will be understood that other components and types can be substituted. Further, gates 26 are described herein as being connected to column buses 21 and drains 27 are described as being connected to row buses 22 but it will be understood by those skilled in the art that the terms "rows" and "columns" are completely interchangeable and are not intended to limit passive array 10 or active matrix 16 to a specific orientation.

Figure 3:
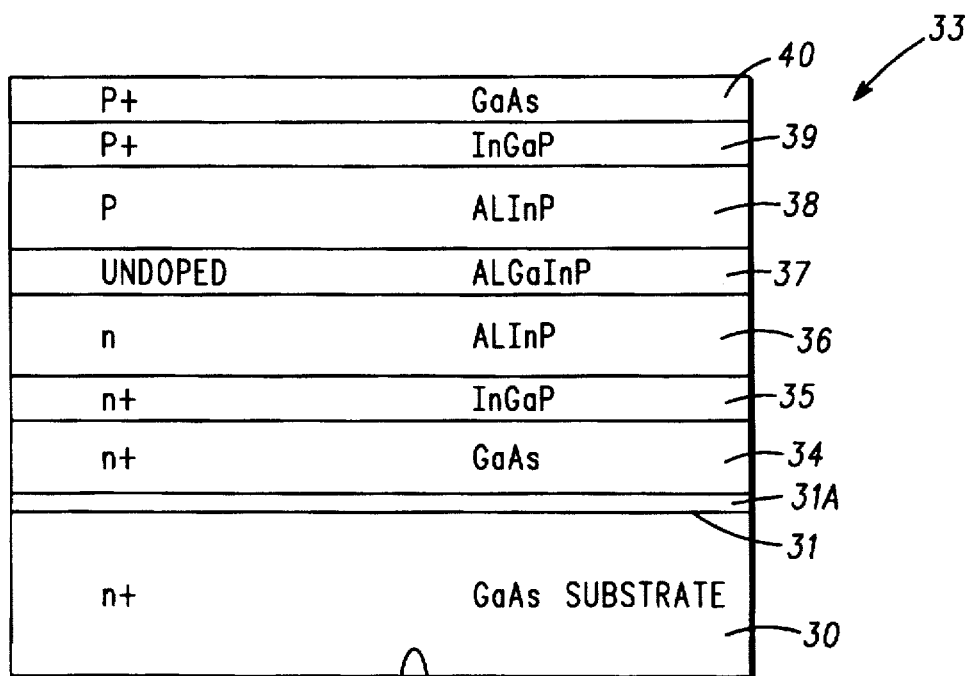
FIGS. 3–10 are simplified cross-sectional views illustrating various intermediate steps in the fabrication of an active LED array.

Turning now to FIGS. 3–10, simplified cross-sectional views illustrating various intermediate steps in the fabrication of the active circuitry shown in FIG. 2 are illustrated. Referring specifically to FIG. 3, a substrate 30 is illustrated, which in this specific embodiment is formed of gallium arsenide (GaAs) relatively heavily doped for n+ conduction. Substrate 30 has an upper surface 31 and a lower surface 32. A plurality of layers 33 of material are positioned on upper surface 31 of substrate 30, with plurality of layers 33 cooperating to emit light when activated. It should be understood that plurality of layers 33 can include semiconductor material to form a semiconductor light emitting diode or organic material to form an organic electroluminescent device. In this specific embodiment plurality of layers 33 are epitaxially grown semiconductor layers.

An optional AlGaAs or InGaP etch stop layer 31A is epitaxially grown on surface 31 of substrate 30 for purposes that will be explained presently. A first layer 34 is epitaxially grown semiconductor material (n+ GaAs) which acts as a buffer layer to crystalographically match the following layers to substrate 30 (and etch stop 31A, if present). A second layer 35 is included to provide a match between the GaAs material system and the material system of the LEDs. Layer 35 includes n+ doped InGaP. Layers 34 and 35 are heavily doped to provide lower electrical contact layers for array 15, as will be apparent presently. A third layer 36 is formed of lightly n doped AlInP and forms the cathode terminal for the LEDs. A fourth layer 37 is an active or light emitting layer of the LEDs and in this embodiment is undoped AlGaInP. Anode terminals for the LEDs are formed by a lightly p doped layer 38 of AlInP grown on fourth layer 37 with a material system matching layer 39 of heavily p+ doped InGaP grown thereon and an upper contact layer 40 of heavily p+ doped GaAs completing the plurality of layers 33.

Figure 4:
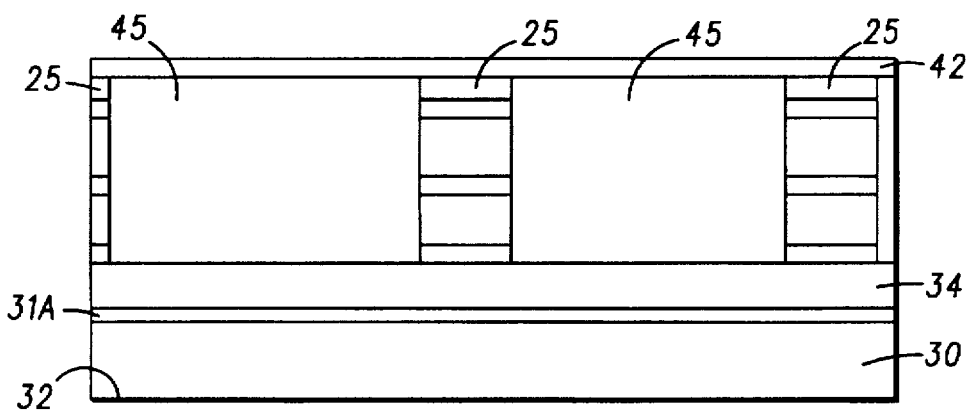

Referring specifically to FIG. 4, a dielectric layer 42, which may be, for example, silicon nitride ($Si_3N_4$), silicon dioxide ($SiO_2$), etc. is deposited on the upper surface of contact layer 40 to insulate contact layer 40 from the following structure. Row and column dividers are formed in plurality of layers 33 so as to divide plurality of layers 33 into an array of light emitting devices arranged in rows and columns, e.g. array 15 of LEDs 25 of FIG. 2. In this preferred embodiment, the row and column dividers 45 are formed by implants. The implants generally include some inactive material, such as oxygen ions (O+), hydrogen ions (H+), or the like, implanted in a well known manner at energies sufficiently high to carry the implants deep enough to isolate adjacent LEDs 25 (at least through active layer 37) by forming a high resistance volume surrounding each LED 25. It should be understood that FIGS. 3–10 are not drawn to scale and various portions are exaggerated in size for a complete understanding of the process and structure.

Figure 5:
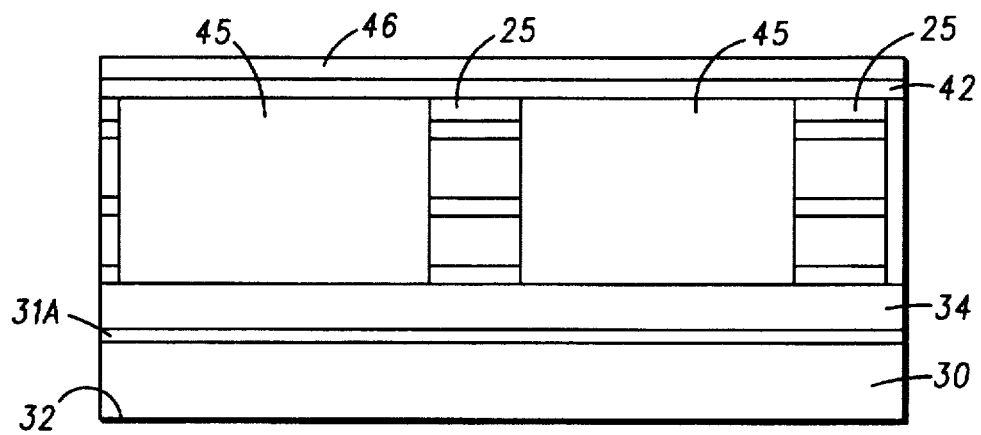
Figure 6:
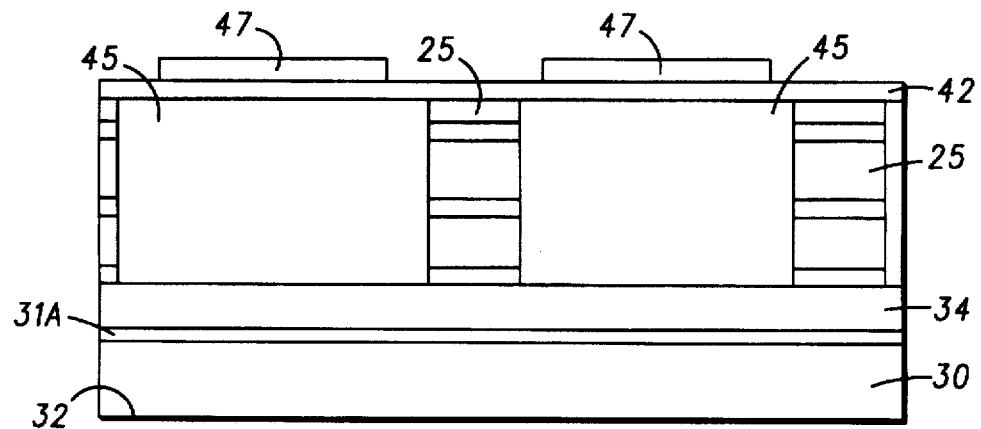

With row and column dividers 45 in place and defining rows and columns of LEDs 25, a plurality of portions of recrystallized amorphous silicon are patterned on row dividers 45, one each adjacent each LED 25, generally as follows. A layer 46 of amorphous silicon is formed on the surface of dielectric layer 42, as illustrated in FIG. 5. Layer 46 of amorphous silicon is recrystallized utilizing any of the well known processes, including laser recrystallization (e.g. using an xcimer laser), thermal recrystallization, etc. The recrystallized amorphous silicon is masked and etched, using any convenient procedure (e.g. dry or wet etch) to form portions 47 of recrystallized amorphous silicon on row dividers 45 adjacent each LED 25, as illustrated in FIG. 6.

Figure 7:
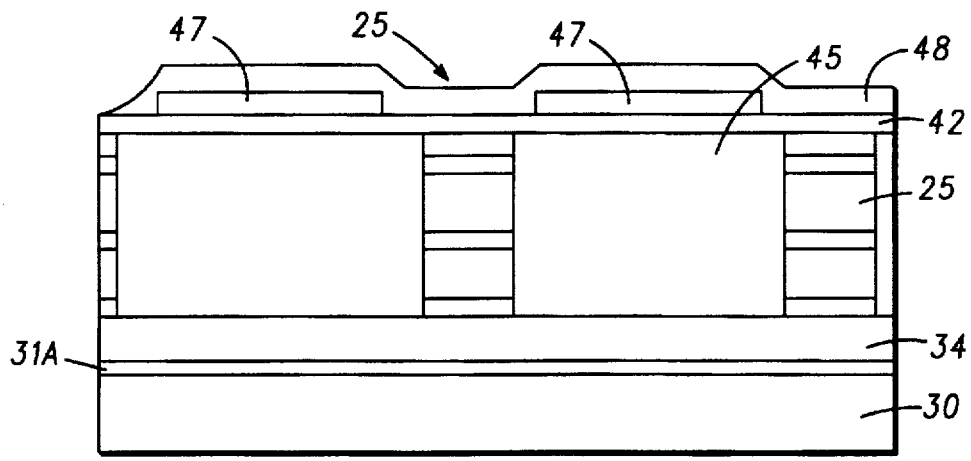

A plurality of active control circuits, one each are formed in each of the portions 47. While each of the active control circuits can include one or more components, such as transistors, electronic switches, etc., in this specific embodiment a field effect transistor (FET) is incorporated in series with each LED 25 as a switch. The portions 47 of recrystallized amorphous silicon are used as a substrate in which to form the electronic switches, as described below. A thin layer 48 of gate dielectric, which in this preferred embodiment is a thermal or PECVD deposited oxide, is formed in a blanket over the entire array area, as illustrated in FIG. 7.

Figure 8:
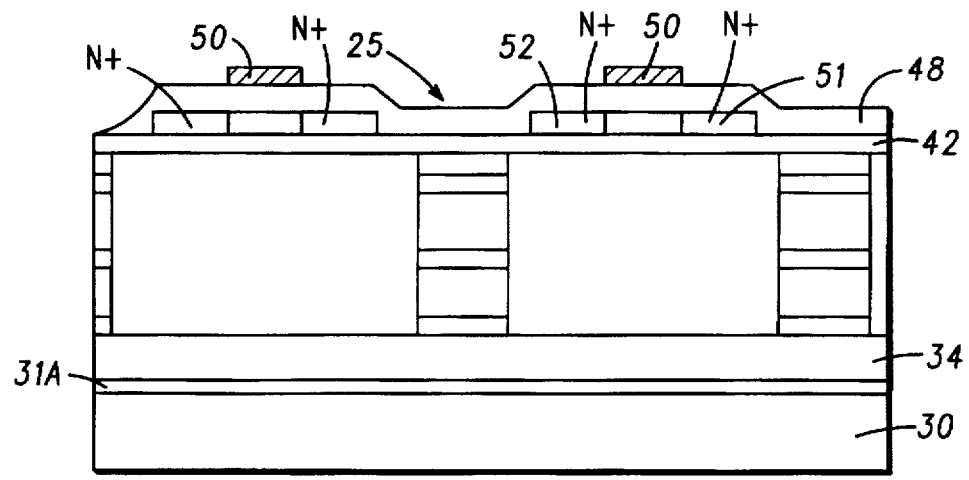

Gates 50 are deposited and patterned on layer 48 of dielectric material, approximately centrally over portions 47 of recrystallized amorphous silicon, as illustrated in FIG. 8. Gates 50 are formed of some convenient gate material, such as polysilicon, TiW, Al, etc. Gates 50 are then used as a self-aligned mask to implant power terminals, such as a source 51 and a drain 52, adjacent each gate 50 in each portion 47 of recrystallized amorphous silicon. In this embodiment, the source and drain terminals 51 and 52 are implants which, when properly activated, produce n+ doped areas that operate as spaced apart power terminals in a fashion that is well understood in the semiconductor art.

Figure 9:
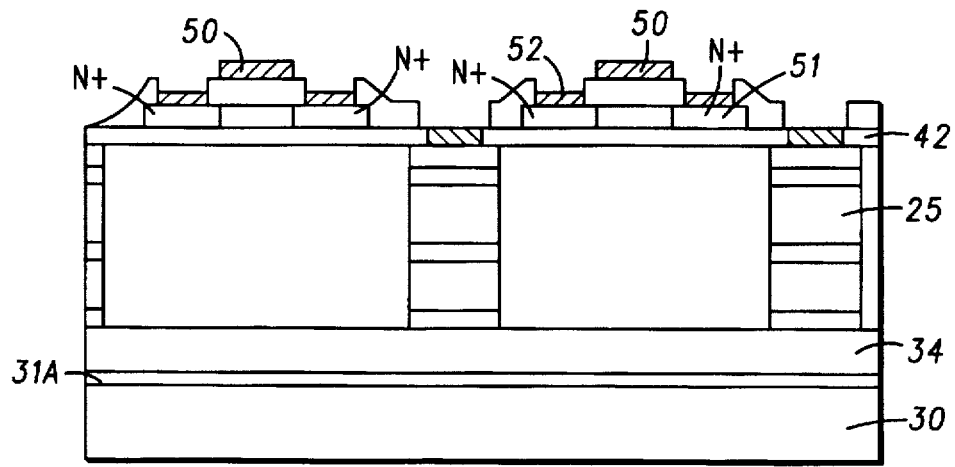

Openings are etched through layer 48 of dielectric material, and dielectric layer 42 over LEDs 25, to open contact areas with each source 51, drain 52, and LED 25 and ohmic metal is deposited in the openings to form external contacts therewith, as illustrated in FIG. 9. A dielectric layer 53, such as $Si_3N_4$, is deposited in a blanket layer over the entire array 15 and openings are again etched to provide contacts to each gate 50, source 51, drain 52, and LED 25. A first metallization is then performed to connect the ohmic metal of each source to the ohmic metal of each adjacent or associated LED 25, as indicated by metallization 54 of FIG. 10. Also, the first metallization connects all of the gates 50 in each column into column buses, which are also connected to column drivers 17, as will be explained presently. Further, the first metallization connects the ohmic metal of each drain in each row into row buses, which are also connected to row drivers 16, as will be explained presently, and bonding pads 55 are provided adjacent the edges of the structure. It will be seen presently, that various steps in the different processes (e.g. implants, layer formation, metallization, etc.) to be explained may simultaneously achieve different results in different areas and any description of the various process steps throughout this disclosure is not intended to limit the steps to a specific sequence.

Figure 10:
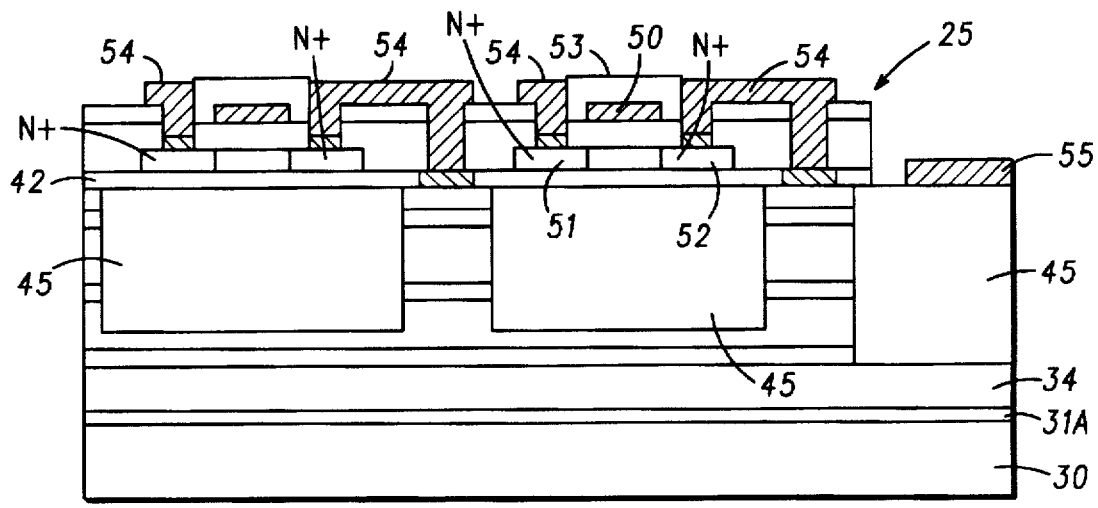
Figure 11:
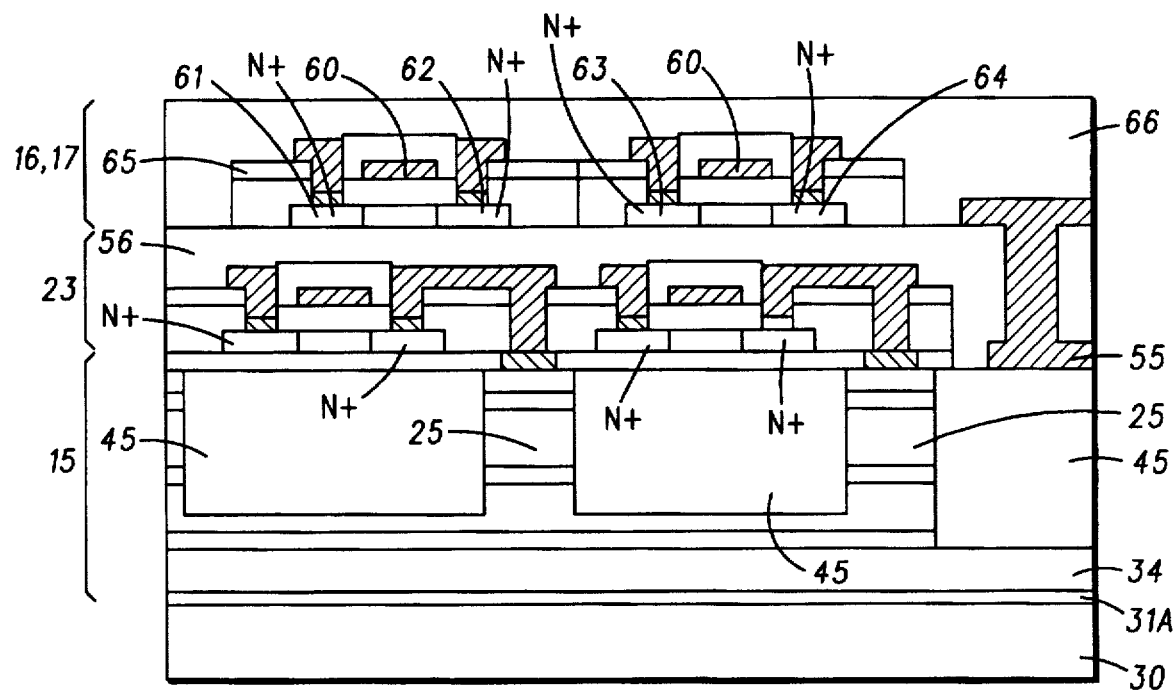
FIGS. 11–13 are simplified cross-sectional views illustrating various steps in the formation of stacked driving circuitry on the active LED matrix of FIG. 10 in accordance with the present invention.

Referring now to FIG. 11, active LED matrix 15 is illustrated from FIG. 10 with an insulation layer 56 formed thereover to provide a planarized surface overlying active LED matrix 15. Insulation layer 56 can be any convenient insulating material, such as a field oxide or the like, which is thick enough to provide sufficient planarization for the following steps. A plurality of portions 57 of recrystallized amorphous silicon are patterned on insulation layer 56, generally as follows. A layer of amorphous silicon is formed on the surface of insulation layer 56 (see FIG. 5). The layer of amorphous silicon is recrystallized utilizing any of the well known processes, including laser recrystallization (e.g. using an xcimer laser), thermal recrystallization, etc. The recrystallized amorphous silicon is then masked and etched, using any convenient procedure (e.g. dry or wet etch) to form portions 57 of recrystallized amorphous silicon (see FIG. 6). It will of course be understood that the patterning and recrystallization steps can be reversed, if convenient.

A plurality of metal-oxide-semiconductor field effect transistors (MOSFETs), one each are formed in each of portions 57. While each portion 57 can include one or more components, such as transistors, electronic switches, etc., in this specific embodiment a field effect transistor (FET) is incorporated because of the simplicity of manufacture. Portions 57 of recrystallized amorphous silicon are used as a substrate in which to form the MOSFETs, as described below. A thin layer 58 of gate dielectric, which in this preferred embodiment is a thermal or PECVD deposited oxide, is formed in a blanket over the entire array (see FIG. 7).

Gates 60 are deposited and patterned on layer 58 of dielectric material, approximately centrally over portion 57 of recrystallized amorphous silicon, as illustrated in FIG. 8. Gates 60 are formed of some convenient gate material, such as polysilicon, TiW, Al, etc. Gates 60 are then used as a self-aligned mask to implant power terminals, such as a source 61 and a drain 62, adjacent each gate 60 in each portion 57 of recrystallized amorphous silicon. In this example, the source and drain terminals 61 and 62 are implants which, when properly activated, produce n+ doped areas that operate as spaced apart power terminals in a fashion that is well understood in the semiconductor art. It should be understood, however, that some of the FETs produced will have p+ doped areas to form source and drain terminals 63 and 64, which p+ doped areas are formed by simple masking and repeating the above steps, as will be understood by those skilled in the art.

Openings are etched through layer 57 of dielectric material to open contact areas with each source 61, 63 and drain 62 64 and ohmic metal is deposited in the openings to form external contacts therewith, as illustrated in FIG. 11. A dielectric layer 65, such as $Si_3N_4$, is deposited in a blanket layer over the entire driver circuitry and openings are again etched to provide contacts to each gate, source, and drain, as well as to bond pads 55. Metallizations are then performed to connect the ohmic metal of each source 63 and drain 64 to the appropriate bond pads 55, column buses 21, or row buses 22, as illustrated in FIG. 11. Thus, the metallizations connect all of the LEDs 25 in each column into column buses, which are also connected to column drivers 17, and all of the LEDs 25 in each row into row buses, which are also connected to row drivers 16. A passivation layer 66 is deposited in a blanket layer over the entire structure to provide passivation and planarization.

Figure 12:
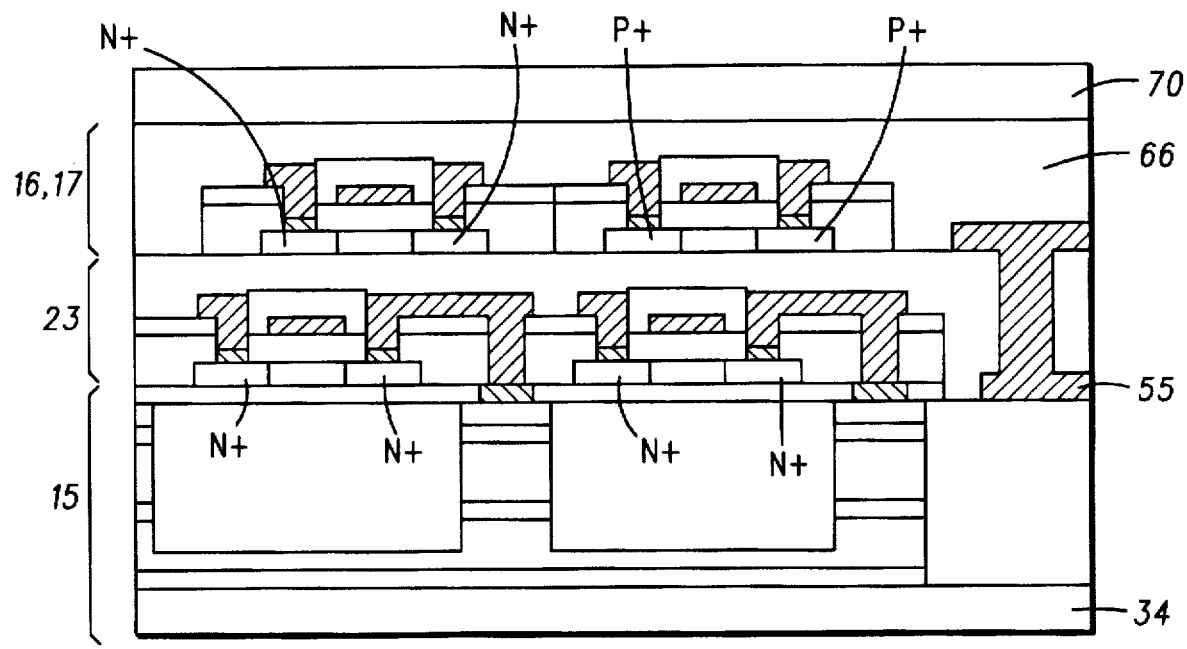
Figure 13:
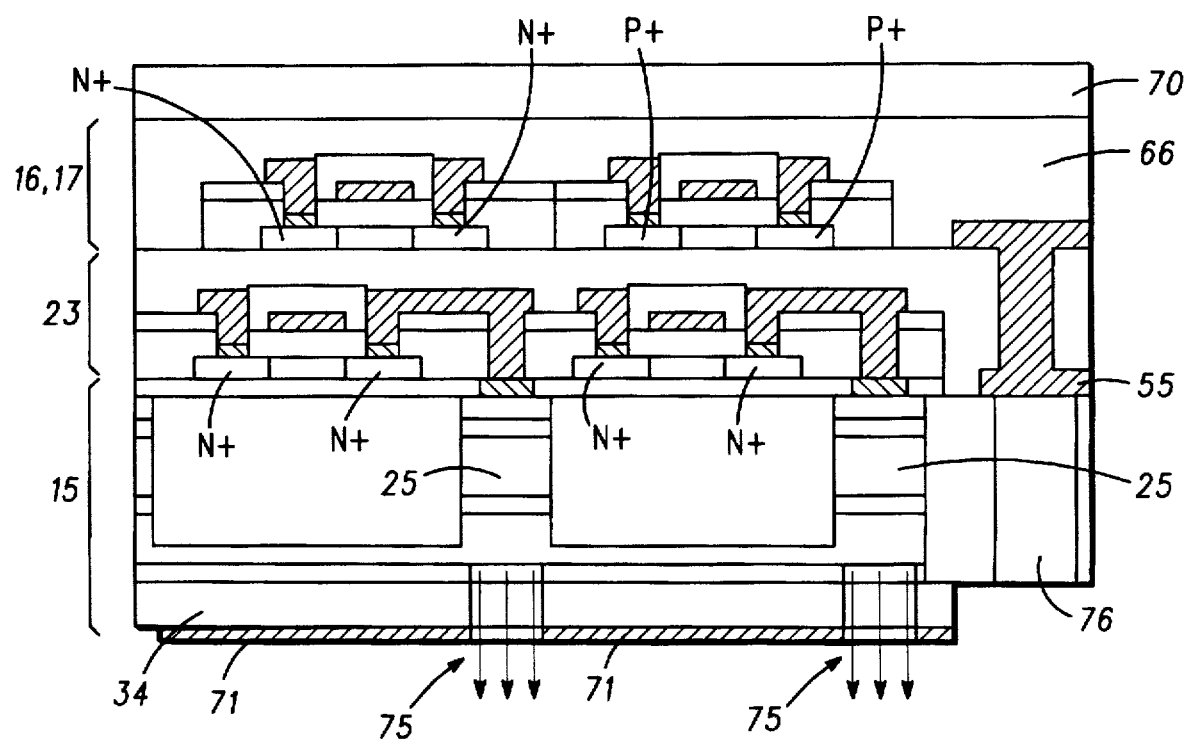

As illustrated in FIG. 12, a supporting substrate 70, which in this embodiment is a semi-insulating substrate, is mounted on the upper planarized surface of layer 66 using any convenient method, including polishing and molecular bonding, conventional adhesives, etc. Once supporting substrate 70 is fixedly in place, semiconductor substrate 30 is removed by any convenient process including etching (with or without an included etch-stop layer), polishing, polishing and etching, etc. If etch-stop layer 31A is included, etching substrate 30 to, or through, etch-stop layer 31A can be conveniently achieved. Removing substrate 30 exposes a lower surface of the plurality of layers 33 and specifically a surface of heavily doped layer 34 is exposed. If a small portion of the thin etch-stop layer 31A remains, this will have no effect since it is also heavily doped n+. Second terminals 71 (cathodes in this embodiment) are positioned on the exposed surface of layer 34, as illustrated in FIG. 13. Also, windows 75 are opened through layer 34 (and/or any other layers desired) to provide an unobstructed emission site for light from LEDs 25. Further, openings 76 are formed to allow contact with bond pads 55.

Figure 14:
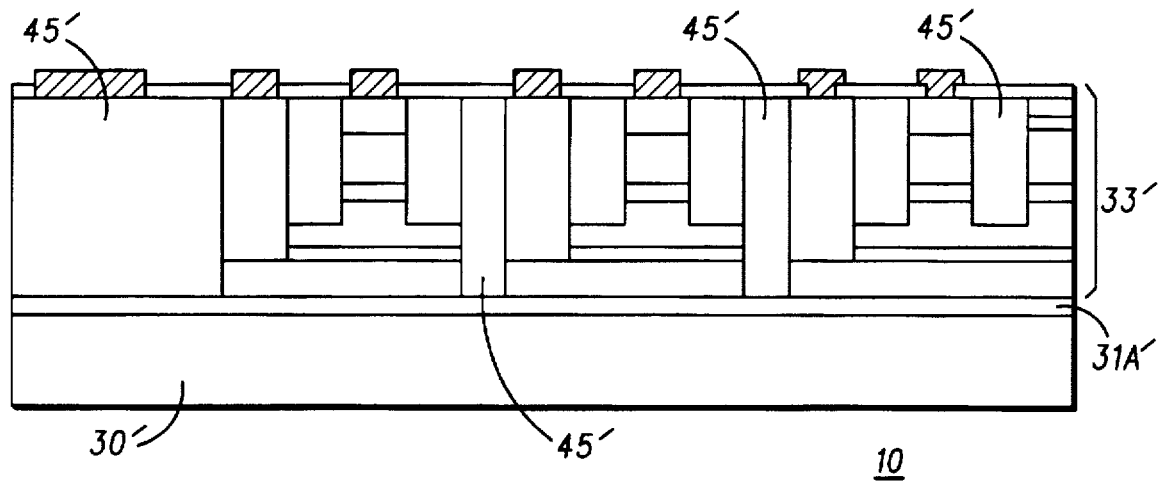
FIG. 14 is a simplified cross-sectional view of a passive LED matrix.
Figure 15:
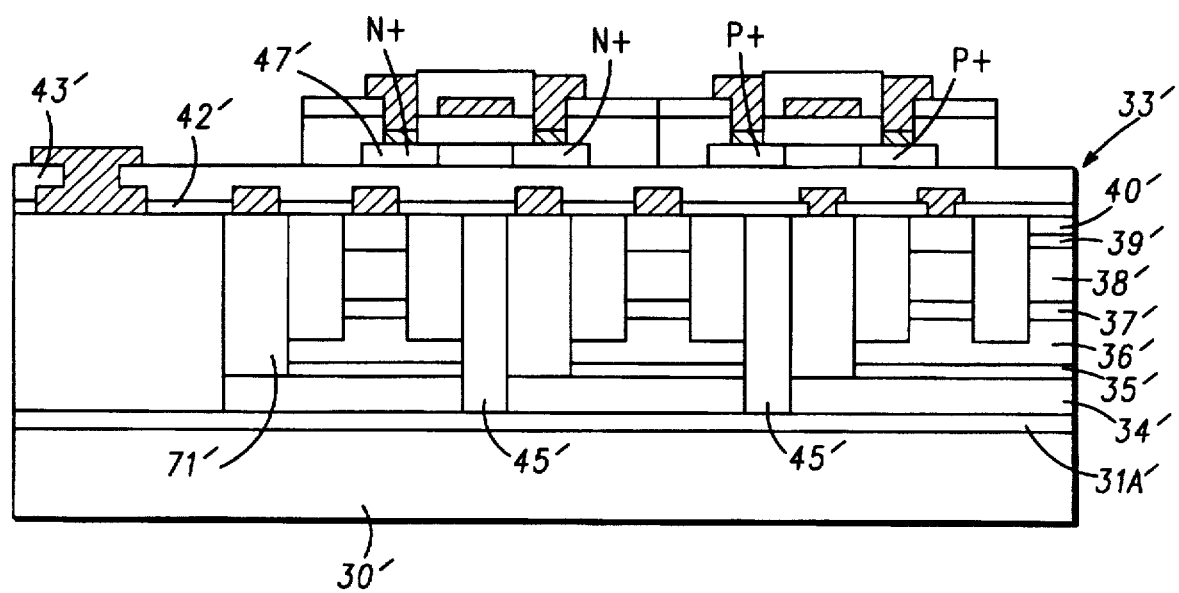
FIGS. 15–17 are simplified cross-sectional views illustrating various steps in the formation of stacked driving circuitry on the passive LED matrix of FIG. 14 in accordance with the present invention.
Figure 16:
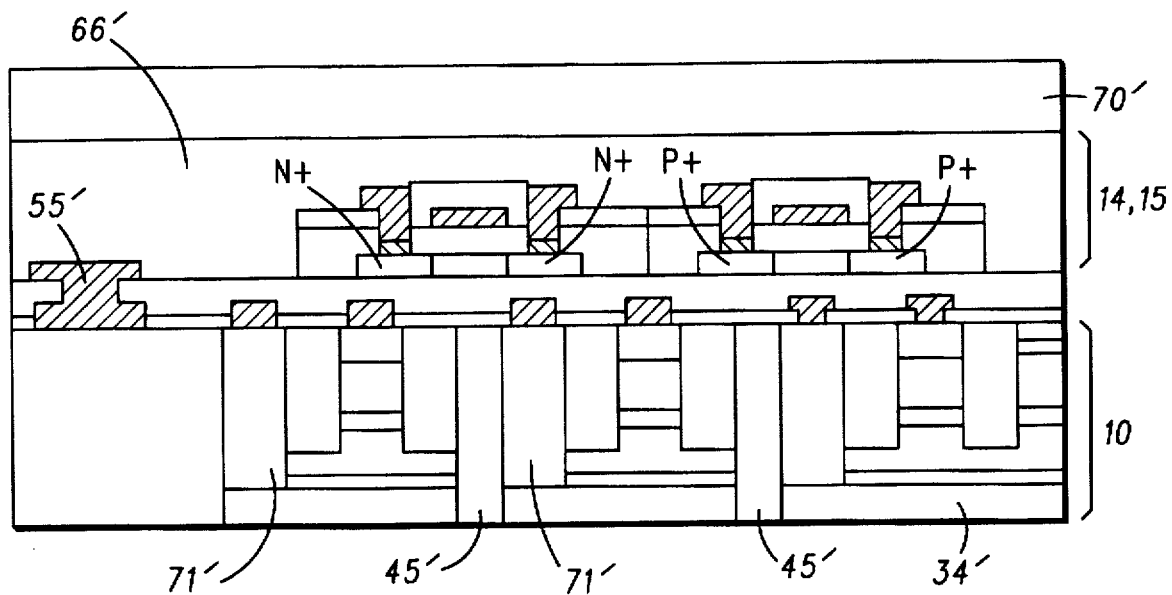
Figure 17:
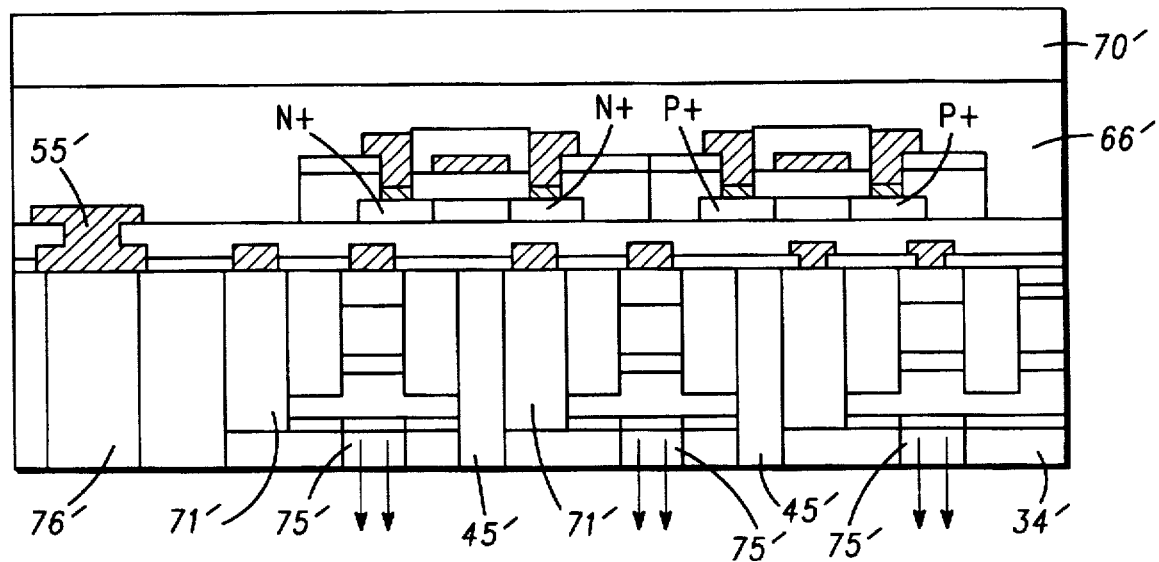

Turning now to FIG. 14, a simplified cross-sectional view of passive array 10 (illustrated schematically in FIG. 1) is illustrated including a plurality of LEDs 11 arranged in rows and columns with the anodes connected into columns by column buses 12 and the cathodes connected into rows by row buses 13. As will be seen presently, the fabrication steps performed in conjunction with FIGS. 15–17 are similar to those previously described in conjunction with FIGS. 3–10 and similar components are designated with similar numbers but a prime is added to all numbers to indicate the different embodiment. In this embodiment, a substrate 30' is provided as explained in conjunction with FIG. 3, and a plurality of layers 33' are formed thereon, also as described in conjunction with FIG. 3. A dielectric layer 42', which may be, for example, silicon nitride ($Si_3N_4$), silicon dioxide ($SiO_2$), etc. is deposited on the upper surface of contact layer 40' to insulate contact layer 40' from the following structure. Row and column dividers are formed in plurality of layers 33' so as to divide plurality of layers 33' into array 10 of light emitting devices 11 arranged in rows and columns (e.g. array 10 of LEDs 11 of FIG. 1). In this preferred embodiment, the row and column dividers 45 are formed by implants. The implants generally include some inactive material, such as oxygen ions (O+), hydrogen ions (H+), or the like, implanted in a well known manner at energies sufficiently high to carry the implants deep enough to isolate adjacent LEDs 11 (at least through active layer 37') by forming a high resistance volume surrounding each LED 11. It should be understood that FIG. 15 is not drawn to scale and various portions are exaggerated in size for a complete understanding of the process and structure.

In this embodiment it should be noted that a lower contact is made to each of LEDs 11 by means of implants 71', such as silicon or the like for heavy n doping, which extend deep enough to contact at least one of layers 34', 35', and/or 36'. Also, a metallization procedure connects all of the anodes of each LED 11 in each column into column buses 12 and all of the cathodes in each row into row buses 13. With row and column dividers 45' in place and defining rows and columns of LEDs 11, an insulating and planarizing layer 43' is formed over dielectric layer 42'. A plurality of portions 47' of recrystallized amorphous silicon are patterned on layer 43' overlying array 10, one each adjacent each LED 11, generally as described previously. A plurality of column and row driver circuits 14, 15, one each are formed in each of the portions 47'. While each of the driver circuits can include one or more components, such as transistors, electronic switches, etc., in this specific embodiment a single field effect transistor (FET) is illustrated in portion 47' for simplicity. A thin layer 48' of gate dielectric is formed over the structure and gates 50' are deposited and patterned on layer 48' approximately centrally over portions 47' (see FIG. 8). Gates 50' are then used as a self-aligned mask to implant a source 51' and a drain 52', adjacent each gate 50' in each portion 47' of recrystallized amorphous silicon. In this embodiment, the source and drain terminals 51', 53' and 52', 54' are implants which, when properly activated, produce n+ or p+ doped areas that operate as spaced apart power terminals, as explained in more detail above.

Ohmic metal is deposited in openings communicating with the source, drain and gate of each FET to form external contacts therewith (see FIG. 9). A dielectric layer 53', such as $Si_3N_4$, is deposited in a blanket layer over the entire array 10 and openings are again etched to provide contacts to each gate 50', source 51', 53', drain 52', 54', and LED 11. A first metallization is then performed to connect the ohmic metal of each FET to the column and row buses 12, 13 and to bonding pads 55'. Again, it should be understood that various steps in the different processes (e.g. implants, layer formation, metallization, etc.) may simultaneously achieve different results in different areas and any description of the various process steps throughout this disclosure is not intended to limit the steps to a specific sequence.

As illustrated in FIG. 16, a passivation and planarizing layer 66' is deposited over the entire structure and a supporting substrate 70', which in this embodiment is a semi-insulating substrate, is mounted on the upper planarized surface of layer 66' using any convenient method, including polishing and molecular bonding, conventional adhesives, etc. Once supporting substrate 70' is fixedly in place, semiconductor substrate 30' is removed by any convenient process including etching (with or without etch-stop layer 31A'), polishing, polishing and etching, etc. If etch-stop layer 31A' is included, etching substrate 30' to, or through, etch-stop layer 31A' can be conveniently achieved. Removing substrate 30' exposes a lower surface of the plurality of layers 33' and specifically a surface of heavily doped layer 34' is exposed. If a small portion of the thin etch-stop layer 31A' remains, this will have no effect since it is also heavily doped n+. Windows 75' are opened through layer 34' (and/or any other layers desired) to provide an unobstructed emission site for light from LEDs 11, as illustrated in FIG. 17. Further, openings 76' are formed to allow contact with bond pads 55'.

Thus, it can be seen that the I/O count is greatly improved and the area required for interconnects is greatly reduced because the driver circuits are formed directly on the array as a single monolithic integrated circuit. Also, the number of process steps required to form a complete structure are greatly reduced. Further, by incorporating MOSFETS, and specifically complementary MOSFET circuits for driving the LED array, simpler and more reliable transistors are provided and the power requirements are greatly reduced.

Thus, new and improved stacked driver circuitry and an LED array are disclosed with a substantial reduction in the amount of chip area utilized for drivers, which substantially increases the amount of chip area that can be used for the array. Also, the number of I/O pads is substantially reduced and the metal interconnects are shortened or reduced to feedthroughs, which further reduces the amount of chip area utilized. Because of these improvements, an integrated array and driver circuitry is produced which is easier and less expensive to fabricate and use. Further, the new and improved LED array and driving circuitry includes MOSFETs which are connected in complementary circuits that result in a substantial saving in power and connecting area.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An LED array and stacked driving circuitry on a semiconductor substrate comprising:

a semiconductor substrate having a surface;

a plurality of overlying layers of material sequentially formed on the surface of the substrate, the plurality of layers of material cooperating to emit light when activated;

an insulating layer positioned in overlying relationship to the plurality of overlying layers;

the plurality of layers of material being divided into a plurality of individual light emitting devices arranged in a two dimensional array of rows and columns;

row and column driver circuits positioned on the insulating layer in overlying relationship to the two dimensional array including a plurality of portions of recrystallized amorphous silicon positioned on the insulating layer in overlying relationship to the two dimensional array, a gate insulator layer, with a gate metal layer positioned on the gate insulator layer, positioned on each of the plurality of portions of recrystallized amorphous silicon to form an MOS gate, first and second spaced apart power terminals in each of the plurality of portions of recrystallized amorphous silicon and positioned on opposite sides of the MOS gate to form a field effect transistor, and electrical contacts in communication with the first and second spaced apart power terminals and the MOS gate; and each individual light emitting device in the two dimensional array being coupled to the row and column driver circuits.

2. An LED array and stacked driving circuitry on a semiconductor substrate as claimed in claim 1 wherein the semiconductor substrate includes a substrate of one of GaAs, SiC, semi-insulating GaAs, and Sapphire.

3. An LED array and stacked driving circuitry on a semiconductor substrate as claimed in claim 1 wherein the plurality of layers of material include layers of organic material.

4. An LED array and stacked driving circuitry on a semiconductor substrate as claimed in claim 1 wherein the plurality of layers of material include epitaxial layers of semiconductor material grown on the surface.

5. An LED array and stacked driving circuitry on a semiconductor substrate as claimed in claim 4 wherein the row and column dividers in the plurality of layers include material implanted to increase the resistance and isolate the light emitting devices from each other.

6. An LED array and stacked driving circuitry on a semiconductor substrate as claimed in claim 5 wherein the implanted material includes one of oxygen and hydrogen ions implanted in the semiconductor layers of material.

7. An LED array and stacked driving circuitry on a supporting substrate comprising:

a plurality of sequentially formed overlying layers of material, the plurality of layers of material cooperating to emit light when activated;

an insulating layer positioned in overlying relationship to the plurality of overlying layers;

the plurality of layers of material being divided into a plurality of individual light emitting devices arranged in a two dimensional array of rows and columns;

row and column driver circuits positioned on the insulating layer in overlying relationship to the two dimensional array including a plurality of portions of recrystallized amorphous silicon positioned on the insulating layer in overlying relationship to the two dimensional array, a gate insulator layer, with a gate metal layer positioned on the gate insulator layer, positioned on each of the plurality of portions of recrystallized amorphous silicon to form an MOS gate, first and second spaced apart power terminals in each of the plurality of portions of recrystallized amorphous silicon and positioned on opposite sides of the MOS gate to form a field effect transistor, and electrical contacts in communication with the first and second spaced apart power terminals and the MOS gate;

each individual light emitting device in the two dimensional array being coupled to the row and column driver circuits;

a passivation layer positioned over the row and column driver circuits; and a supporting substrate attached to the passivation layer.

8. An LED array and stacked driving circuitry on a supporting substrate as claimed in claim 7 wherein the plurality of layers of material have a surface with light emission windows formed therein, one each for each individual light emitting device in the array and further including ohmic metal contacts positioned in communication with the row and column driver circuits.

9. A monolithically integrated LED array and driving circuitry comprising:

a plurality of overlying layers of semiconductor material sequentially epitaxially grown on the surface of the substrate, the plurality of layers of material cooperating to emit light when activated;

a first insulating layer positioned on the plurality of overlying layers;

row and column dividers formed in the plurality of layers of material in the array area so as to divide the plurality of layers of material into an array of light emitting devices arranged in rows and columns;

a plurality of active control circuits formed on the first insulating layer, one each associated with each light emitting device in the array, including a plurality of portions of recrystallized amorphous silicon positioned on the insulating layer in overlying relationship to the light emitting device array and adjacent an associated light emitting device, a gate insulator layer with a gate metal layer on the gate insulator layer positioned on each of the plurality of portions of recrystallized amorphous silicon to form an MOS gate, first and second spaced apart power terminals formed in each of the plurality of portions of recrystallized amorphous silicon, on opposite sides of the MOS gate, to define a field effect transistor adjacent each associated light emitting device, and electrical contacts in communication with the first and second spaced apart power terminals and the gate metal layer and including row and column buses, and one of the first and second power terminals being connected to the adjacent light emitting device;

a second insulating layer positioned on the plurality of active control circuits;

row and column driver circuits positioned on the second insulating layer in overlying relationship to the plurality of active control circuits including a plurality of portions of recrystallized amorphous silicon positioned on the second insulating layer in overlying relationship to the plurality of active control circuits, a gate insulator layer with a gate metal layer positioned on the gate insulator layer, positioned on each of the plurality of portions of recrystallized amorphous silicon to form an MOS gate, first and second spaced apart power terminals formed in each of the plurality of portions of recrystallized amorphous silicon on opposite sides of the MOS gate; and electrical contacts in communication with the first and second spaced apart power terminals and the MOS gate, and the row and column buses being coupled to the row and column driver circuits.

10. An LED array and stacked driving circuitry as claimed in claim 9 including in addition a passivation layer positioned over the row and column driver circuits and a supporting substrate attached to the passivation layer.

11. An LED array and stacked driving circuitry as claimed in claim 10 wherein the plurality of layers of material have a surface with light emission windows formed therein, one each for each individual light emitting device in the array and further including ohmic metal contacts positioned in communication with the row and column driver circuits.

* * * * *